(12) United States Patent
Kim

(10) Patent No.: US 10,846,009 B2
(45) Date of Patent: Nov. 24, 2020

(54) MEMORY DEVICE HAVING GLOBAL LINE GROUPS IN WHICH DATA INPUT AND OUTPUT UNITS ARE DIFFERENT FROM EACH OTHER

(71) Applicant: SAMSUNG ELECTRONICS CO., LTD., Suwon-si (KR)

(72) Inventor: Kyungryun Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 97 days.

(21) Appl. No.: 16/002,298

(22) Filed: Jun. 7, 2018

(65) Prior Publication Data

US 2019/0146703 A1 May 16, 2019

(30) Foreign Application Priority Data

Nov. 13, 2017 (KR) .......................... 10-2017-0150739

(51) Int. Cl.
  *G06F 3/06* (2006.01)
  *G11C 7/12* (2006.01)
  *G06F 12/02* (2006.01)
  *G06F 11/10* (2006.01)

(52) U.S. Cl.
  CPC ............ *G06F 3/0646* (2013.01); *G06F 3/061* (2013.01); *G06F 3/0673* (2013.01); *G06F 11/108* (2013.01); *G06F 11/1048* (2013.01); *G06F 12/0207* (2013.01); *G11C 7/12* (2013.01)

(58) Field of Classification Search
  None
  See application file for complete search history.

(56) References Cited

U.S. PATENT DOCUMENTS

| 6,378,102 | B1 | 4/2002 | Watanabe et al. | |
| 7,489,570 | B2 * | 2/2009 | Kim | G11C 7/18 365/185.13 |
| 7,616,512 | B2 * | 11/2009 | Kim | G11C 7/18 365/185.23 |
| 7,668,036 | B2 | 2/2010 | Kim | |
| 8,472,272 | B2 * | 6/2013 | Kajigaya | G11C 7/02 365/203 |
| 8,520,449 | B2 * | 8/2013 | Kajigaya | G11C 11/4097 365/189.04 |

(Continued)

FOREIGN PATENT DOCUMENTS

| KR | 10-2009-0127643 A | 12/2009 |
| KR | 10-2016-0139155 A | 12/2016 |

*Primary Examiner* — Phung M Chung
(74) *Attorney, Agent, or Firm* — Lee IP Law, PC

(57) ABSTRACT

A memory device includes first, second, third, and fourth memory cell groups and first and second transmitters. The first and second memory cell groups share first local lines. The third and fourth memory cell groups share second local lines. The first transmitter transmits first data to first global lines based on a read command. The first data is output from one of the first memory cell group and the second memory cell group on the first local lines. The second transmitter transmits second data to second global lines based on the read command. The second data is output from one of the third memory cell group and the fourth memory cell group on the second local lines. The number of the first global lines is different from the number of the second global lines.

18 Claims, 11 Drawing Sheets

(56) References Cited

U.S. PATENT DOCUMENTS

| | | | | |
|---|---|---|---|---|
| 8,614,925 B2* | 12/2013 | Park | ................... | G11C 29/808 |
| | | | | 365/200 |
| 9,064,603 B1* | 6/2015 | Youn | ................... | G11C 7/1045 |
| 9,070,428 B2 | 6/2015 | Lee et al. | | |
| 9,305,608 B2* | 4/2016 | Park | ..................... | G11C 5/06 |
| 9,390,815 B1 | 7/2016 | Hyun et al. | | |
| 9,626,244 B2 | 4/2017 | Sohn et al. | | |
| 9,786,365 B2* | 10/2017 | Zaitsu | ............... | H03K 19/1736 |
| 2010/0329053 A1* | 12/2010 | Park | ................... | G11C 29/785 |
| | | | | 365/200 |
| 2014/0317471 A1* | 10/2014 | Ryu | ..................... | G06F 11/10 |
| | | | | 714/764 |
| 2016/0077940 A1 | 3/2016 | Son et al. | | |
| 2016/0357630 A1 | 12/2016 | Kang et al. | | |
| 2017/0004037 A1 | 1/2017 | Park et al. | | |
| 2017/0192845 A1 | 7/2017 | Kim et al. | | |

\* cited by examiner

MEMORY DEVICE HAVING GLOBAL LINE GROUPS IN WHICH DATA INPUT AND OUTPUT UNITS ARE DIFFERENT FROM EACH OTHER

CROSS-REFERENCE TO RELATED APPLICATION

Korean Patent Application No. 10-2017-0150739, filed on Nov. 13, 2017, and entitled, "Memory Device Having Global Line Groups in Which Data Input and Output Units are Different From Each Other," is incorporated by reference in its entirety.

BACKGROUND

1. Field

One or more embodiments described herein relate to a memory device having global line groups in which data input and output units are different from each other.

2. Description of the Related Art

Mobile phones, computers, and other electronic devices use memory devices to store data. Attempts are continually being made to increase memory capacity. As the number of memory cells in a memory device increases, the probability that an error will occur in stored data increases and/or bit error rate may become higher. Accordingly, some memory devices store information (e.g., parity bits) for correcting data errors.

In these or other memory devices, sub memory cell arrays or mats in a memory cell array may be the same as each other. However, the size of information (e.g., parity bits) stored to correct data errors may vary with the number of data bits to be stored in the memory device, the number of correctable bits, a kind of an error correction code, and/or other factors. When data of various sizes are stored in sub memory cell arrays or mats that are implemented to be the same as each other, the useable area of the memory device for storing data may be reduced and/or the layout of the memory device may be complicated.

SUMMARY

In accordance with one or more embodiments, a memory device includes a first memory cell group and a second memory cell group that share first local lines; a third memory cell group and a fourth memory cell group that share second local lines; a first transmitter to transmit first data to first global lines based on a read command, the first data output from one of the first memory cell group and the second memory cell group on the first local lines; and a second transmitter to transmit second data to second global lines based on the read command, the second data output from one of the third memory cell group and the fourth memory cell group on the second local lines, wherein the number of the first global lines is different from the number of the second global lines.

In accordance with one or more other embodiments, a memory device includes first memory cells corresponding to column addresses; second memory cells corresponding to the column addresses; a first write driver to transmit first data to a part of the first memory cells through first global lines based on a write command; and a second write driver to transmit second data to a part of the second memory cells through second global lines based on the write command, wherein the number of the first global lines is different from the number of the second global lines.

In accordance with one or more other embodiments, a memory device includes first memory cells selected depending on a first column select signal transmitted through a first column select line; second memory cells selected depending on a second column select signal transmitted through a second column select line; first column select switches to connect first bit lines connected to the first memory cells and first local lines depending on the first column select signal; second column select switches to connect second bit lines connected to the second memory cells and second local lines depending on the second column select signal; a first transmitter to transmit first data to first global lines based on a read command, the first data output from the first memory cells to the first local lines through the first bit lines; and a second transmitter to transmit second data to second global lines in response to the read command, the second data output from the second memory cells to the second local lines through the second bit lines, wherein the number of the first global lines is different from the number of the second global lines.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
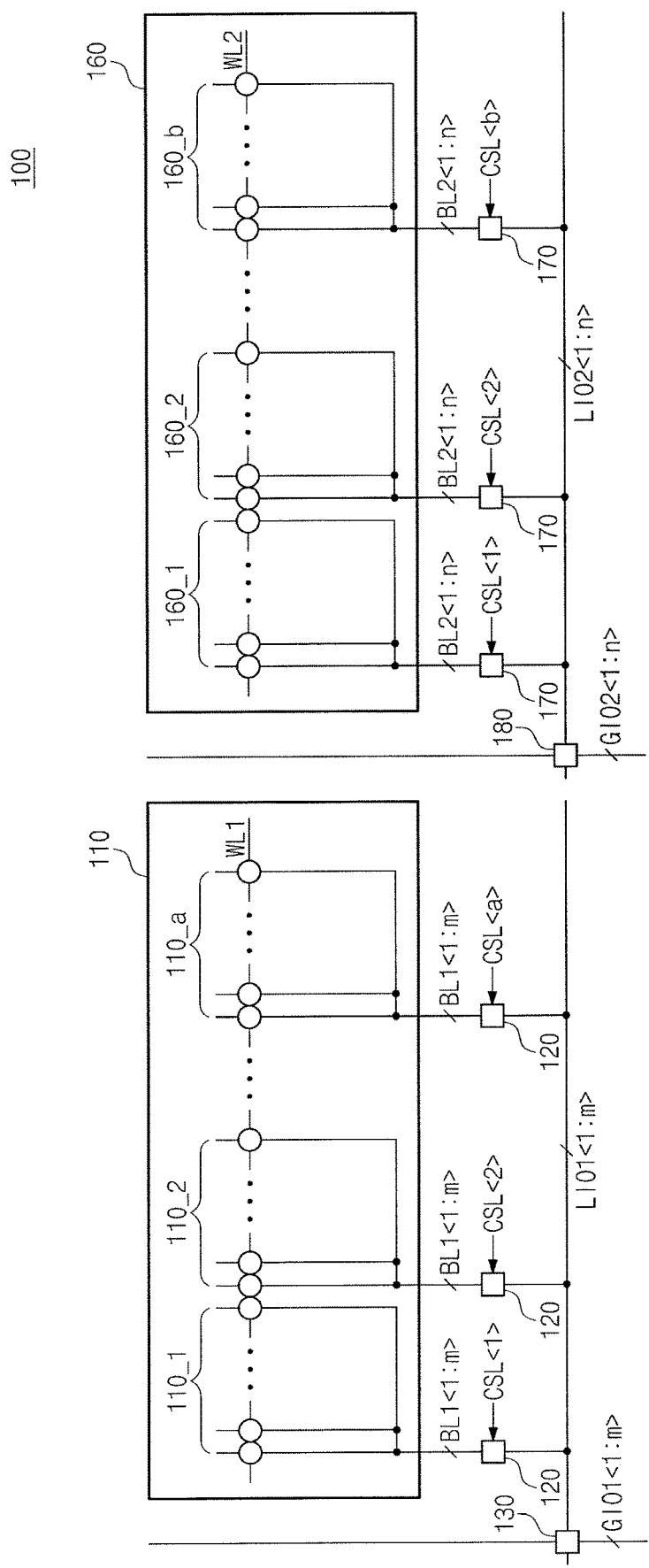
FIG. 1 illustrates an embodiment of a memory device.

FIG. 1 illustrates an embodiment of a memory device 100 which may include a first mat 110, first column select switches 120, a first transmission circuit (or transmitter) 130, a second mat 160, second column select switches 170, and a second transmission circuit (or transmitter) 180. The first mat 110 may include first memory cells connected to a first word line WL1. The first memory cells may be classified into first to a-th memory cell groups 110_1 to 110_a depending, for example, on first to a-th column select signals CSL<1:a>.

The first memory cells of the first memory cell group 110_1 may be respectively connected to first bit lines BL1<1:m>. The number of first memory cells of the first memory cell group 110_1 may be "m," where "m" may be determined, for example, depending on a data input and output unit, a prefetch size, a burst length, and the like of the memory device 100. In one embodiment, "m" may indicate the number of first memory cells selected by one of the first to a-th column select signals CSL<1:a> in the first mat 110. For example, "m" may be a power of 2 such as 2, 4, 8, 16, 32, etc.

The first memory cell group 110_1 may be selected depending on the first column select signal CSL<1>. The second memory cell group 110_2 may be selected depending on the second column select signal CSL<2>. The a-th memory cell group 110_a may be selected depending on the a-th column select signal CSL<a>. At least one of the first to a-th column select signals CSL<1:a> may be activated depending on a read command or a write command, and thus at least one of the first to a-th memory cell groups 110_1 to 110_a may be selected. In one embodiment, "a" may be a natural number, for example, determined, for example, depending on column addresses CAs that the memory device 100 receives.

In the first mat 110, the number of first memory cells that are connected to the first word line WL1 and correspond to the column addresses CAs may be a power of 2 such as 512, 1024, 2048, etc. Also, the first mat 110 may further include dummy memory cells and redundancy memory cells for improving yield. In addition, other word lines may be disposed in the first mat 110, and the first mat 110 may further include memory cells connected to the other word lines.

In an embodiment, each of the first memory cells may include at least one of a dynamic random access memory (DRAM) cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, and a magnetic random access memory (MRAM) cell.

The first column select switches 120 may electrically connect first local lines LIO1<1:m> and the first bit lines BL1<1:m>, connected to one of the first to a-th memory cell groups 110_1 to 110_a, depending on the first to a-th column select signals CSL<1:a>. The memory device 100 may perform data input/output on the first memory cells of the first mat 110 through the first local lines LIO1<1:m>. For example, the first memory cells of the first mat 110 may share the first local lines LIO1<1:m>.

The first transmission circuit 130 may be a circuit for data transmission between the first local lines LIO1<1:m> and first global lines GIO1<1:m>. Accordingly, the first memory cells of the first mat 110 may share the first global lines GIO1<1:m> as well as the first local lines LIO1<1:m>.

The second mat 160 may be implemented to be similar to the first mat 110. The second mat 160 may include second memory cells connected to a second word line WL2. The second memory cells may be classified into first to b-th memory cell groups 160_1 to 160_b depending on first to b-th column select signals CSL<1:b>. The number of second memory cells connected to the second word line WL2 may be the same as or different from the number of first memory cells connected to the first word line WL1. In the second mat 160, the number of second memory cells connected to the second word line WL2 and corresponding to the column addresses CAs may be a power of 2 such as 512, 1024, 2048, etc., or a multiple of 2. The second word line WL2 and the first word line WL1 may correspond to a value of the same row addresses RAs and may be respectively driven by sub word line drivers.

Second memory cells of the first memory cell group 160_1 may be respectively connected to second bit lines BL2<1:n>. The number of second memory cells of the first memory cell group 160_1 may be "n" different from "m". For example, "n" may be a power of 2 such as 2, 4, 8, 16, 32, etc., or may be a multiple of 2 and not be the power of 2 such as 6, 12, etc.

The first memory cell group 160_1 may be selected, for example, depending on the first column select signal CSL<1>. A second memory cell group 160_2 may be selected depending on the second column select signal CSL<2>. A b-th memory cell group 160_b may be selected depending on a b-th column select signal CSL<b>. At least one of the first to b-th column select signals CSL<1:b> may be activated depending on the read command or the write command, and thus at least one of the first to b-th memory cell groups 160_1 to 160_b may be selected. In one embodiment, "b" may be determined depending on the column addresses CAs that the memory device 100 receives, and in at least one instance "b" may be the same as or different from "a".

The second mat 160 may store, for example, second data for correcting an error of first data. In the second mat 160, the number of memory cells connected to the second word line WL2 and corresponding to the column addresses CAs may be a power of 2 such as 512, 1024, 2048, etc., or may not be a power of 2 such as 384, 640, 768, 832, etc.

The second column select switches 170 may connect second local lines LIO2<1:n> and second bit lines BL2<1:n>, connected to any one of the first to b-th memory cell groups 160_1 to 160_b, depending on the first to b-th column select signals CSL<1:b>. The memory device 100 may perform data input/output on the second memory cells of the second mat 160 through the second local lines LIO2<1:n>. For example, the second memory cells of the second mat 160 may share the second local lines LIO2<1:n>.

The second transmission circuit 180 may transmit data between the second local lines LIO2<1:n> and second global lines GIO2<1:n>. Accordingly, the second memory cells of the second mat 160 may share the second global lines GIO2<1:n> as well as the second local lines LIO2<1:n>.

In an embodiment, the number of the first global lines GIO1<1:m> may serve as a data input/output path for the first memory cells of the first mat 110 and may be connected to the first local lines LIO1<1:m>. The first global lines GIO1<1:m> may be different from the number of the second global lines GIO2<1:n>, which may serve as a data input/output path for the second memory cells of the second mat 160 and which may be connected to the second local lines LIO2<1:n>.

In one embodiment, the number of the first global lines GIO1<1:m> may serve as a data input/output path for first memory cells of the first mat 110 selected by one of the first to a-th column select signals CSL<1:a>. The first global lines GIO1<1:m> may be different from the number of the second global lines GIO2<1:n>, which may serve as a data input/output path for second memory cells of the second mat 160 selected by one of the first to b-th column select signals CSL<1:b>. Thus, according to an embodiment, the memory device 100 may include global line groups (e.g., the first global lines GIO1<1:m> and the second global lines GIO2<1:n>) that serve as data input and output units that are different from each other.

Figure 2:
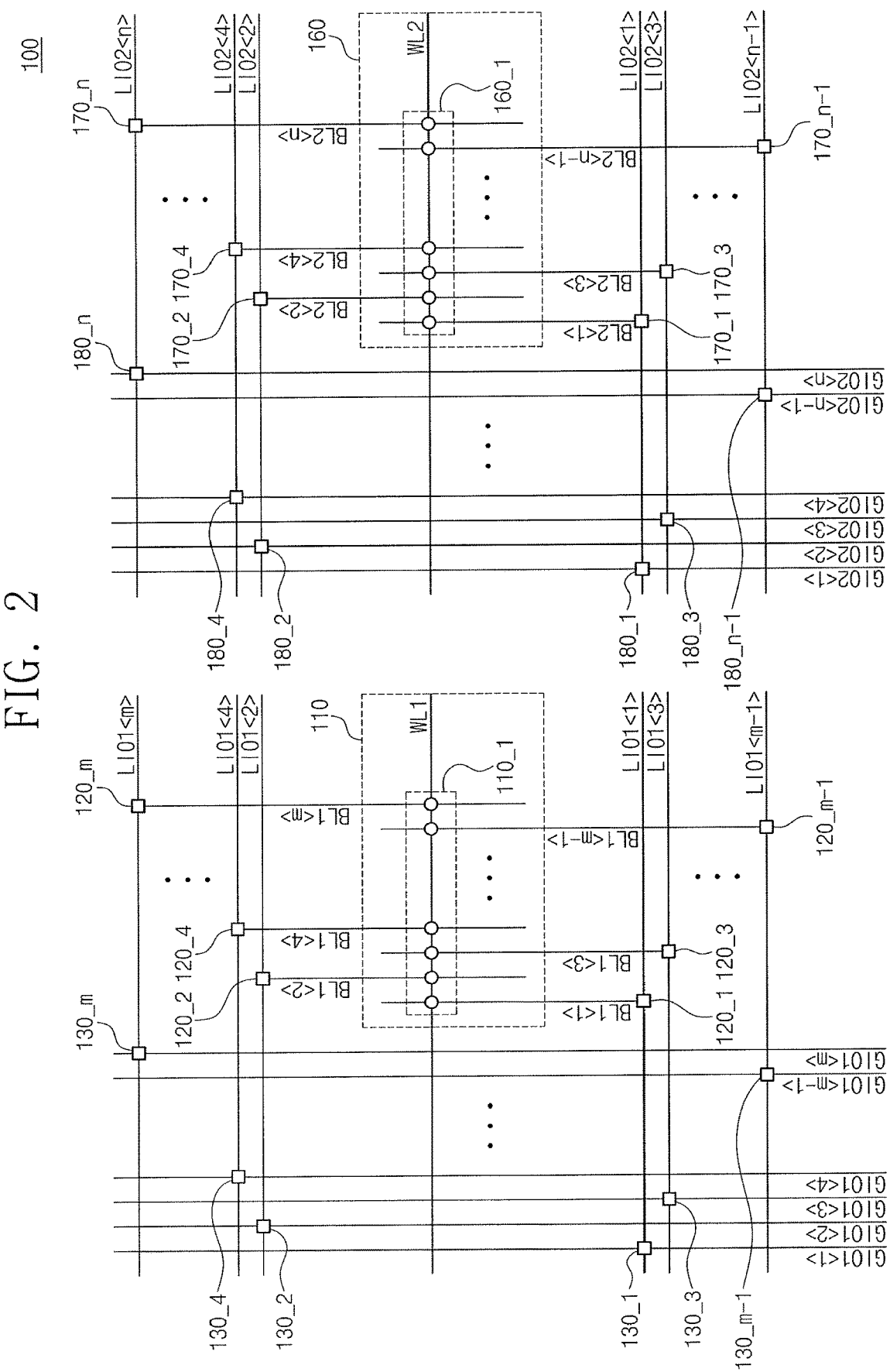
FIG. 2 illustrates another embodiment of a memory device.

FIG. 2 illustrates an embodiment of a memory device, which, for example, may be a more detailed version of the memory device 100 of FIG. 1. In FIG. 2, the first memory cell group 110_1 of the first mat 110 and the first memory cell group 160_1 of the second mat 160 are illustrated for example purposes, with the understanding that memory cells of additional groups may be included.

Referring to FIG. 2, the first bit lines BL1<1:m> may be disposed according to an open bit line structure. In one embodiment, the open bit line structure may correspond to a structure in which a bit line BL and a complementary bit line BLB are not disposed side-by-side with respect to a bit line sense amplifier BLSA for increasing net dies. For example, a first complementary bit line BLB<1> of a first bit line BL1<1> may be in another mat adjacent to the first mat 110. A first complementary bit line BLB<2> of a first bit line BL1<2> may be in another mat adjacent to the first mat 110. The remaining first bit lines BL1<3:m> may be disposed in a similar manner. The arrangement structure of bit lines of FIG. 2 is only exemplary. Bit lines may be disposed according to a folded bit line structure or another structure in other embodiments.

First column select switches 120_1 to 120_m may electrically connect the first bit lines BL1<1:m> and the first local lines LIO1<1:m>, respectively. The first column select switches 120_1 to 120_m may be included in the first column select switches 120 for the first memory cell group 110_1 of FIG. 1. The first column select switches 120_1 to 120_m may be simultaneously turned on by the first column select signal CSL<1> (e.g., refer to FIG. 1) transmitted through a column select line depending on a read command or a write command.

Depending on the read command, bits of first data stored in the first memory cell group 110_1 may be respectively output to the first local lines LIO1<1:m> through the first bit lines BL1<1:m> and the first column select switches 120_1 to 120_m. The first data may refer to data stored in the first mat 110. In one embodiment, depending on the write command, bits of first data may be transmitted to the first memory cell group 110_1 through the first local lines LIO1<1:m>, the first column select switches 120_1 to 120_m, and the first bit lines BL1<1:m>.

The first local lines LIO1<1:m> may be disposed in parallel with the first word line WL1 and may be input/output lines corresponding to a horizontal length of the first mat 110. According to the open bit line structure, the first local lines LIO1<1>, LIO1<3>, LIO1<m-1> may be between the first mat 110 and the other mat (e.g., disposed below the first mat 110). The first local lines LIO1<2>, LIO1<4>, LIO1<m> may be between the first mat 110 and the other mat (e.g., disposed above the first mat 110). The arrangement area of the first local lines LIO1<1>, LIO1<3>, LIO1<m-1> and/or the arrangement area of the first local lines LIO1<2>, LIO1<4>, LIO1<m> may be different (e.g., arranged in an opposite manner) in another embodiment.

First transmission circuits 130_1 to 130_m may transmit bits of first data output from the first mat 110, through the first bit lines BL1<1:m> and the first local lines LIO1<1:m>, to the first global lines GIO1<1:m> based on a read command. The first transmission circuits 130_1 to 130_m may be in the first transmission circuit 130 of FIG. 1. Depending on bits of first data output to the first local lines LIO1<1:m>, the first transmission circuits 130_1 to 130_m may drive the first global lines GIO1<1:m> or may electrically connect the first local lines LIO1<1:m> and the first global lines GIO1<1:m>.

The first transmission circuits 130_1 to 130_m may electrically connect the first global lines GIO1<1:m> and the first local lines LIO1<1:m> based on a write command. When the first global lines GIO1<1:m> and the first local lines LIO1<1:m> are connected by the first transmission circuits 130_1 to 130_m, the bits of the first data may be transmitted to the first mat 110 through the first global lines GIO1<1:m>, the first transmission circuits 130_1 to 130m, and the first local lines LIO1<1:m>. Thus, the bits of the first data may be stored in the first memory cell group 110_1.

As described above, the first global lines GIO1<1:m> may provide a data input/output path for memory cells of the first mat 110. In one embodiment, the first global lines GIO1<1:m> may provide a data input/output path for memory cells of other mats as well as the first mat 110. The other mats may, for example, correspond to mats disposed in parallel with the first global lines GIO1<1:m> together with the first mat 110. For example, the first global lines GIO1<1:m> may vertically cross the first word line WL1 and the first local lines LIO1<1:m>.

The first global lines GIO1<1:m> may be shared by first memory cells of the first mat 110 and memory cells of mats disposed in parallel with the first global lines GIO1<1:m> together with the first mat 110. The lengths of the first global lines GIO1<1:m> may be greater than the lengths of the first local lines LIO1<1:m>.

In an embodiment, the number of the first global lines GIO1<1:m>, the number of the first transmission circuits 130_1 to 130_m the number of the first local lines LIO1<1:m>, the number of the first column select switches 120_1 to 120_m, the number of the first bit lines BL1<1:m>, and the number of first memory cells of the first memory cell group 110_1 may be equal, e.g., "m".

The second mat 160 may be implemented in a manner similar to the first mat 110. However, unlike the first mat 110, the number of second global lines GIO2<1:n>, the number of second transmission circuits 180_1 to 180_n, the number of second local lines LIO2<1:n>, the number of second column select switches 170_1 to 170_n, the number of second bit lines BL2<1:n>, and the number of second memory cells of the first memory cell group 160_1 in the second mat 160 may be equal, e.g., "n" which is different from "m."

In an embodiment, the number of second memory cells connected to the second word line WL2 of the second mat 160 may be different from the number of first memory cells connected to the first word line WL1 of the first mat 110. For example, the horizontal length of the second mat 160 may be less than the horizontal length of the first mat 110, and the number of second memory cells connected to the second word line WL2 may be less than the number of first memory cells connected to the first word line WL1. The horizontal length of a mat may correspond, for example, to the number of memory cells connected to a word line. Lines for supplying power to memory cells and for data input/output may be in/on an upper layer of the first and second mats 110 and 160.

An example is illustrated in FIG. 2 as the first global lines GIO1<1:m> are on the left of the first mat 110. In one embodiment, the first global lines GIO1<1:m> may be in/on an upper layer of the first mat 110. For example, the first global lines GIO1<1:m> and the first mat 110 may overlap each other when viewed from the top. An example is illustrated in FIG. 2 where the second global lines GIO2<1:

n> are on the left of the second mat 160. In one embodiment, the second global lines GIO2<1:n> may be in/on an upper layer of the second mat 160.

When the first global lines GIO1<1:m> are in each of the first and second mats 110 and 160, intervals of the first global lines GIO1<1:m> in/on the upper layer of the second mat 160 may be narrower than intervals of the first global lines GIO1<1:m> in/on the upper layer of the first mat 110. This is because the horizontal length of the second mat 160 may be less than a horizontal length of the first mat 110. Accordingly, the layout for the second mat 160 may become complicated, and bits transmitted through lines may experience a mutual effect (e.g., coupling).

Referring to FIG. 2, the number of the second global lines GIO2<1:n> may be different from the number of the first global lines GIO1<1:m> depending, for example, on the size of the second mat 160. Accordingly, each of the intervals between the second global lines GIO2<1:n> may be maintained to be the same as each of the intervals between the first global lines GIO1<1:m>. For example, the number of memory cells for each word line of a mat may be proportional to the number of global lines for data input/output of the mat. The memory cells may correspond, for example, to memory cells except for dummy memory cells and redundancy memory cells.

Figure 3:
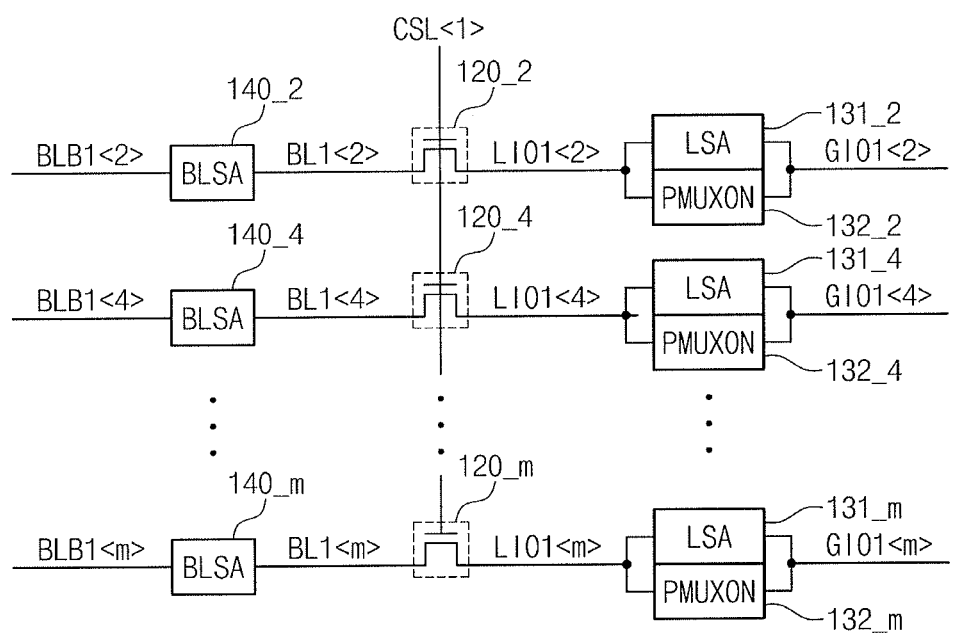
FIG. 3 illustrates another embodiment of a memory device.

FIG. 3 illustrates another embodiment of a memory device, which, for example, may correspond to the memory device of FIG. 2. FIG. 3 will be described with reference to FIG. 2. In FIG. 3, the first column select switches 120_2, 120_4, . . . , 120_m and the first transmission circuits 130_2, 130_4, . . . , 130_m may be in the first mat 110.

The first column select switches 120_2, 120_4, . . . , 120_m may electrically connect the first bit lines BL1<2>, BL1<4>, BL1<m> and the first local lines LIO1<2>, LIO1<4>, LIO1<m> depending on the first column select signal CSL<1>, respectively. The first column select switches 120_2, 120_4, . . . , 120_m may be implemented, for example, by NMOS transistors, PMOS transistors, or a combination of an NMOS and PMOS transistors. The first column select switches 120_1, 120_3, . . . , 120_m–1 may electrically connect the first bit lines BL1<1>, BL1<3>, BL1<m–1> and the first local lines LIO1<1>, LIO1<3>, LIO1<m–1> depending on the first column select signal CSL<1>, respectively.

The first transmission circuit 130_2 of FIG. 2 may include a first local sense amplifier (LSA) 131_2 and a first line select switch (PMUXON) 132_2. As in the first transmission circuit 130_2, the remaining first transmission circuits 130_1 and 130_3 to 130_m may also include first local sense amplifiers 131_1 and 131_3 to 131_m and first line select switches 132_1 and 132_3 to 132_m, respectively.

The first local sense amplifier 131_2 may operate in a read operation. For example, when a bit of first data is output to the first bit line BL1<2> and the first local line LIO1<2> depending on a read command, the first local sense amplifier 131_2 may drive the first global line GIO1<2> depending on the output bit. The bit output to the first local line LIO1<2> may be output to the first global line GIO1<2> by the first local sense amplifier 131_2. The remaining first local sense amplifiers 131_1 and 131_3 to 131_m may operate to be similar to the first local sense amplifier 131_2.

In one embodiment, the first transmission circuit 130_2 of FIG. 2 may include a local switch that electrically connects the first local line LIO1<2> and the first global line GIO1<2> depending on the first column select signal CSL<1> in a read operation, instead of the first local sense amplifier 131_2. The bit output to the first local line LIO1<2> may be output to the first global line GIO1<2> through the local switch. In one embodiment, local switches may be used instead of the remaining first local sense amplifier 131_1 and 131_3 to 131_m.

The first line select switch 132_2 may operate in a write operation. For example, the first line select switch 132_2 may electrically connect the first global line GIO1<2> and the first local line LIO1<2> based on a write command. When the first global line GIO1<2> and the first local line LIO1<2> are connected by the first line select switch 132_2, a bit may be stored in a memory cell through the first global line GIO1<2>, the first local line LIO1<2>, and the first bit line BL1<2>. The remaining first line select switches 132_1 and 132_3 to 132_m may operate in a manner similar to the first line select switch 132_2.

The memory device 100 may include first bit line sense amplifiers 140_1 to 140_m that drive the first bit lines BL1<1:m>, respectively. Only the first bit line sense amplifiers 140_2, 140_4, . . . , 140_m connected to the first bit lines BL1<2>, BL1<4>, . . . , BL1<m> and the first complementary bit lines BLB1<2>, BLB1<4>, BLB1<m> are illustrated in FIG. 3. In one embodiment, the memory device 100 may include the first bit line sense amplifiers 140_1, 140_3, . . . , 140_m–1 connected to the first bit lines BL1<1>, BL1<3>, BL1<m–1> and the first complementary bit lines BLB1<1>, BLB1<3>, . . . , BLB1<m–1>.

When charges of a memory cell connected to the first bit line BL1<2> are output to the first bit line BL1<2> depending on an activation command, the first bit line sense amplifier 140_2 may amplify a difference between a voltage of the first bit line BL1<2> and a voltage of the first complementary bit line BLB1<2>. For example, a bit stored in the memory cell may be output to the first bit line BL1<2> and the first complementary bit line BLB1<2>. The remaining first bit line sense amplifiers 140_1 and 140_3 to 140_m may operate to be similar to the first bit line sense amplifier 140_2.

Examples of the first column select switches 120_2, 120_4, . . . , 120_m and the first transmission circuits 130_2, 130_4, . . . , 130_m in the first mat 110 are illustrated in FIG. 3. The first column select switches 120_1, 120_3, . . . , 120_m–1 and the first transmission circuits 130_1, 130_3, . . . , 130_m–1 in the first mat 110 may be implemented in a manner similar to those of FIG. 3. The second column select switches 170_2, 170_4, . . . , 170_n and the second transmission circuits 180_2, 180_4, 180_n in the second mat 160 may be implemented in a manner similar to those of FIG. 3. The second column select switches 170_1, 170_3, . . . , 170_n–1 and the second transmission circuits 180_1, 180_3, . . . , 180_n–1 in the second mat 160 may be implemented in a manner similar to those of FIG. 3.

Figure 4:
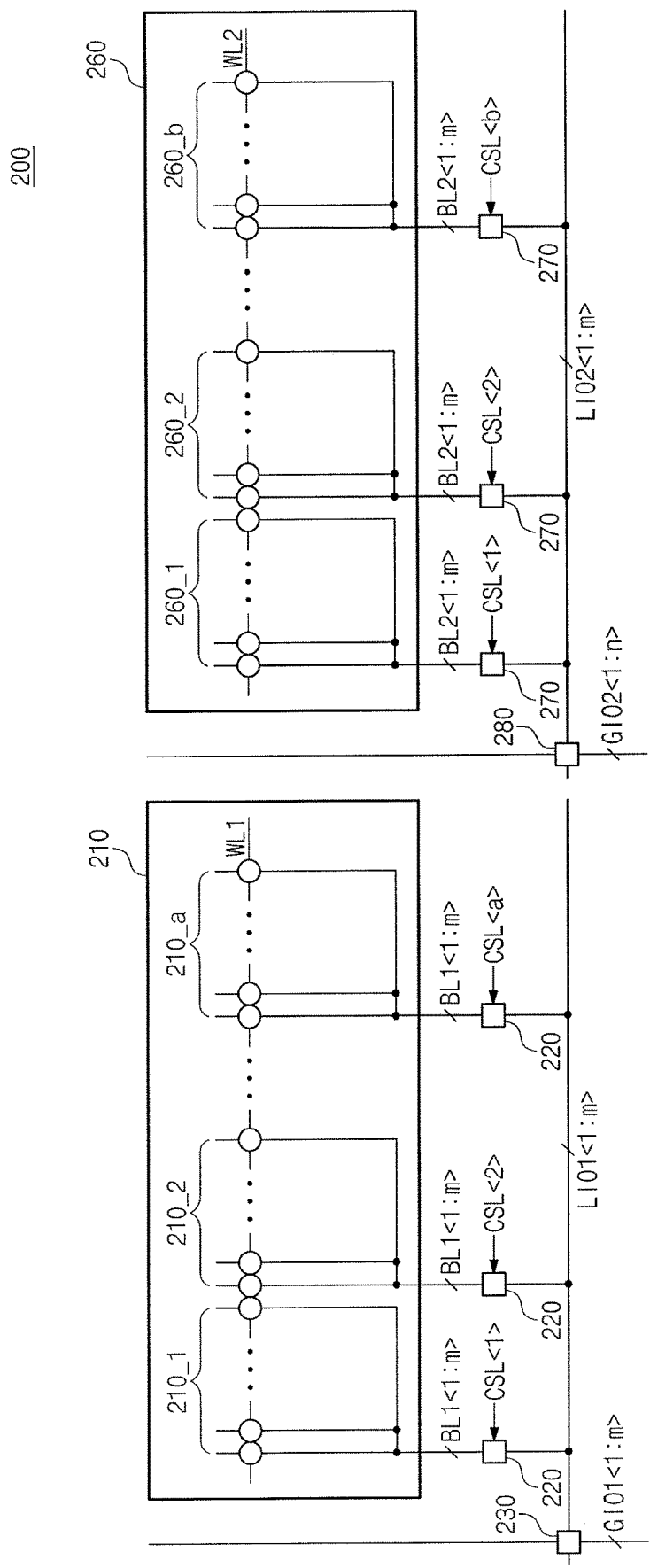
FIG. 4 illustrates another embodiment of a memory device.

FIG. 4 illustrates another embodiment of a memory device 200 which may include a first mat 210, first column select switches 220, a first transmission circuit 230, a second mat 260, second column select switches 270, and a second transmission circuit 280. The first mat 210, the first column select switches 220, and the first transmission circuit 230 may be implemented may be substantially the same as the first mat 110, the first column select switches 120, and the first transmission circuit 130 of FIG. 1. Also, the first bit lines BL1<1:m>, the first local lines LIO1<1:m>, and the first global lines GIO1<1:m> for data input/output of the first mat 210 may be implemented to be substantially the same as the first bit lines BL1<1:m>, the first local lines LIO1<1:m>, and the first global lines GIO1<1:m> for data input/output of the first mat 110 of FIG. 1.

In an embodiment, the number of the first global lines GIO1<1:m> may serve as a data input/output path for first memory cells of the first mat 110 corresponding to column addresses CAs. The first global lines GIO1<1:m> may be different from the number of the second global lines GIO2<1:n>, which may serve as a data input/output path for second memory cells of the second mat 160 corresponding to the column addresses CAs. In one embodiment, the numbers of first memory cells and second memory cells corresponding to the column addresses CAs may be the same as each other.

Referring to FIG. 4, the numbers of the second bit lines BL2<1:m> and the second local lines LIO2<1:m> for data input/output of the second mat 260 may be "m", which may be different from the numbers of the second bit lines BL2<1:n> and the second local lines LIO2<1:n> for data input/output of the second mat 160 of FIG. 1. Also, the number of first memory cells selected by one of the first to a-th column select signals CSL<1:a> in the first mat 210 and the number of second memory cells selected by one of the first to b-th column select signals CSL<1:b> in the second mat 260 may be equal to "m". Also, the number of the first local lines LIO1<1:m> and the number of the second local lines LIO2<1:m> may be equal to "m".

Figure 5:
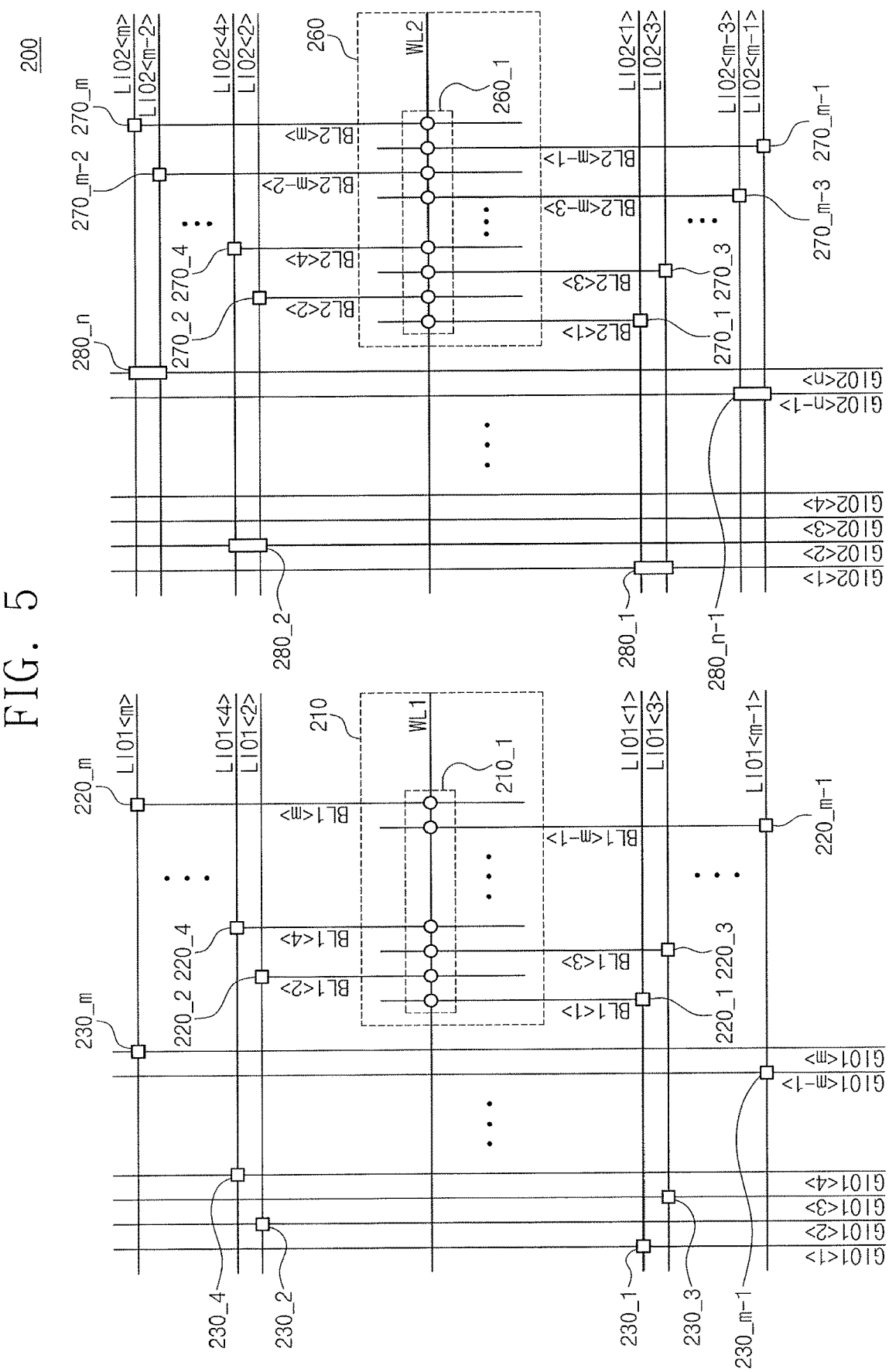
FIG. 5 illustrates another embodiment of a memory device.

FIG. 5 illustrates another embodiment of a memory device, which, for example, may be a more specific implementation of the memory device 200 of FIG. 4. Referring to FIG. 5, the memory device 200 may include the first mat 210, first column select switches 220_1 to 220_m, first transmission circuits 230_1 to 230_m, the second mat 260, second column select switches 270_1 to 270_m, and second transmission circuits 280_1 to 280_n.

The first mat 210, the first column select switches 220_1 to 220_m, and the first transmission circuits 230_1 to 230_m may be substantially the same as the first mat 110, the first column select switches 120_1 to 120_m and the first transmission circuits 130_1 to 130_m of FIG. 2.

Unlike the memory device 100 of FIG. 2, the number of second memory cells of a first memory cell group 260_1 selected by the first column select signal CSL<1>, depending on a read command or a write command, may be "m" and may be the same as the number of first memory cells of a first memory cell group 210_1. The number of the second local lines LIO2<1:m> may be "m" and may be the same as the number of the first local lines LIO1<1:m>.

In an embodiment, since the number of first memory cells of the first memory cell group 260_1 is the same as the number of second memory cells of the first memory cell group 260_1, the second bit lines BL2<1:m>, the second column select switches 270_1 to 270_m, and the second local lines LIO2<1:m> may be substantially the same as the first bit lines BL1<1:m>, the first column select switches 220_1 to 220_m, and the first local lines LIO1<1:m>.

In one embodiment, the number of the second global lines GIO2<1:n> may be different from the number of the first global lines GIO1<1:m>. For example, the number of the second global lines GIO2<1:n> may be different from the number of the second local lines LIO2<1:m>, and the number of the second transmission circuits 280_1 to 280_n may be different from the number of the second local lines LIO2<1:m>. The second transmission circuits 280_1 to 280_n may be substantially the same as the second transmission circuits 180_1 to 180_n of FIG. 2.

In the embodiment of FIG. 5, the number of the second global lines GIO2<1:n> may be less than the number of the second local lines LIO2<1:m>. The memory device 200 may further include multiplexers for data input/output through the second global lines GIO2<1:n> and the second local lines LIO2<1:m>.

Figure 6:
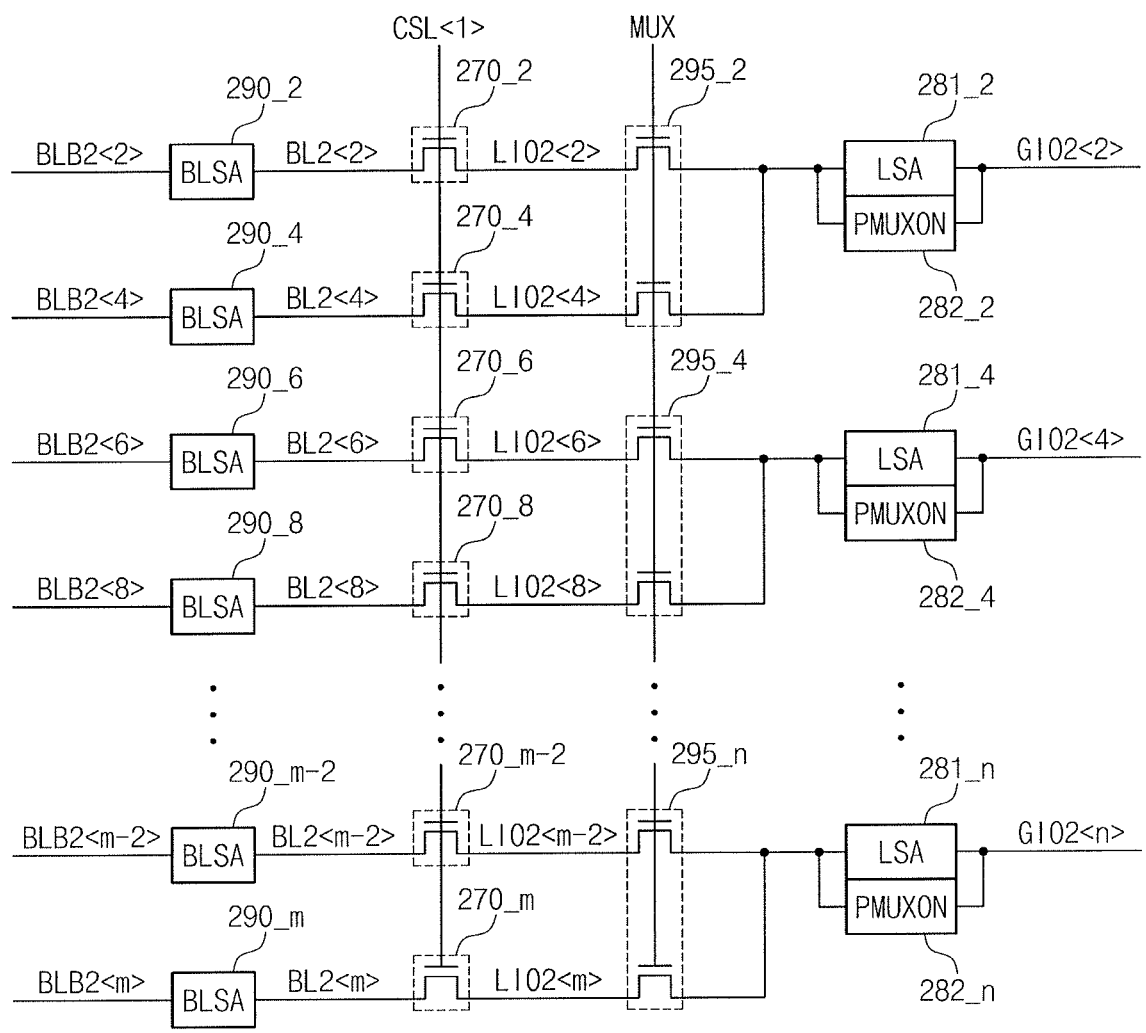
FIG. 6 illustrates another embodiment of a memory device.

FIG. 6 illustrates another embodiment of a memory device, which, for example, may correspond to the memory device 200 of FIG. 5. In FIG. 6, "m" is two times "n," and the second column select switches 270_2, 270_4, . . . , 270_m and the second transmission circuits 280_2, 280_4, . . . , 280_n in the second mat 260 are illustrated in FIG. 6 in detail.

The second complementary bit line BLB2<2>, BLB2<4>, BLB2<m>, the second bit line sense amplifiers 290_2, 290_4, . . . , 290_m, the second bit lines BL2<2>, BL2<4>, BL2<m>, the second column select switches 270_2, 270_4, . . . , 270_m, and the second local lines LIO2<2>, LIO2<4>, LIO2<m> may be substantially the same as the first complementary bit line BLB1<2>, BLB1<4>, BLB1<m>, the first bit line sense amplifiers 140_2, 140_4, . . . , 140_m, the first bit lines BL1<2>, BL1<4>, . . . , BL1<m>, the first column select switches 120_2, 120_4, . . . , 120_m, and the first local lines LIO1<2>, LIO1<4>, LIO1<m> of FIG. 3.

Compared with the memory device 100 of FIG. 3, the memory device 200 may further include multiplexers 295_2 and 295_4 to 295_n. The multiplexer 295_2 may select one of the second local lines LIO2<2> and LIO2<4> depending on a control signal MUX during a read operation or a write operation. For example, the multiplexer may include at least one switch. The control signal MUX may be a signal obtained, for example, by decoding row addresses RAs or column addresses CAs. In one embodiment, the multiplexers 295_2 and 295_4 to 295_n may select part of the second local lines LIO2<2>, LIO2<4>, LIO2<m> depending on row addresses RAs corresponding to an activated word line or column addresses CAs corresponding to selected bit lines. The number of local lines that the multiplexer 295_2 selects may vary among different embodiments. The remaining multiplexers 295_4 to 295_n may operate in substantially the same manner as the multiplexer 295_2. The memory device 200 may further include multiplexers 295_1 and 295_3 to 295_n–1. The number of second local lines selected by the multiplexers 295_1 to 295_n may be "n" and may be the same as the number of the second global lines GIO2<1:n>.

In an embodiment, all memory cells of the first and second mats 210 and 260 connected to first and second word lines WL1 and WL2 may be activated depending on an activation command. Afterwards, when a read command or a write command is received, "m" first memory cells (e.g., first memory cells of the first memory cell group 210_1) belonging to the first mat 210 may be selected from the activated memory cells, and m" second memory cells (e.g., second memory cells of the first memory cell group 260_1) belonging to the second mat 260 may be selected from the activated memory cells. Unlike FIG. 2, "m" second memory cells may be selected in the second mat 260, but data input/output may be performed only on "n" second memory cells of the "m" second memory cells through the multiplexers 295_2 and 295_4 to 295_n.

The second transmission circuit 280_2 may include a second local sense amplifier 281_2 and a second line select switch 282_2. The second local sense amplifier 281_2 and the second line select switch 282_2 may operate to be substantially the same as the first local sense amplifier 131_2 and the first line select switch 132_2 of FIG. 3.

The second local sense amplifier 281_2 may drive the second global line GIO2<2> depending on a bit output to a local line selected by the multiplexer 295_2. The remaining second local sense amplifiers 281_4 to 281_n may operate in a manner similar to the second local sense amplifier 281_2. The memory device 200 may further include second local sense amplifiers 281_1 and 281_3 to 281_n−1. The second local sense amplifiers 281_1 and 281_3 to 281_n−1 may be implemented and operate in a manner similar to the first local sense amplifier 281_2. The number of the second local sense amplifiers 281_1 to 281_n may be the same as the number of the second global lines GIO2<1:n>.

In one embodiment, the second transmission circuit 280_2 of FIG. 5 may include a local switch that electrically connects the second local line LIO2<2> and the second global line GIO2<2> depending on the first column select signal CSL<1> in a read operation, instead of the second local sense amplifier 281_2. Local switches may be used instead of the remaining second local sense amplifiers 281_1 and 281_3 to 281_n.

The second line select switch 282_2 may connect the second global line GIO2<2> and a local line selected by the multiplexer 295_2 based on a write command. The remaining second line select switches 282_4 to 282_n may operate to be similar to the second line select switch 282_2. The memory device 200 may further include second line select switches 282_1 and 282_3 to 282_n−1. The second line select switches 282_1 and 282_3 to 282_n−1 may operate in a manner similar to the second line select switch 282_2. The number of the second line select switches 282_1 to 282_n may be the same as the number of the second global lines GIO2<1:n>.

Figure 7:
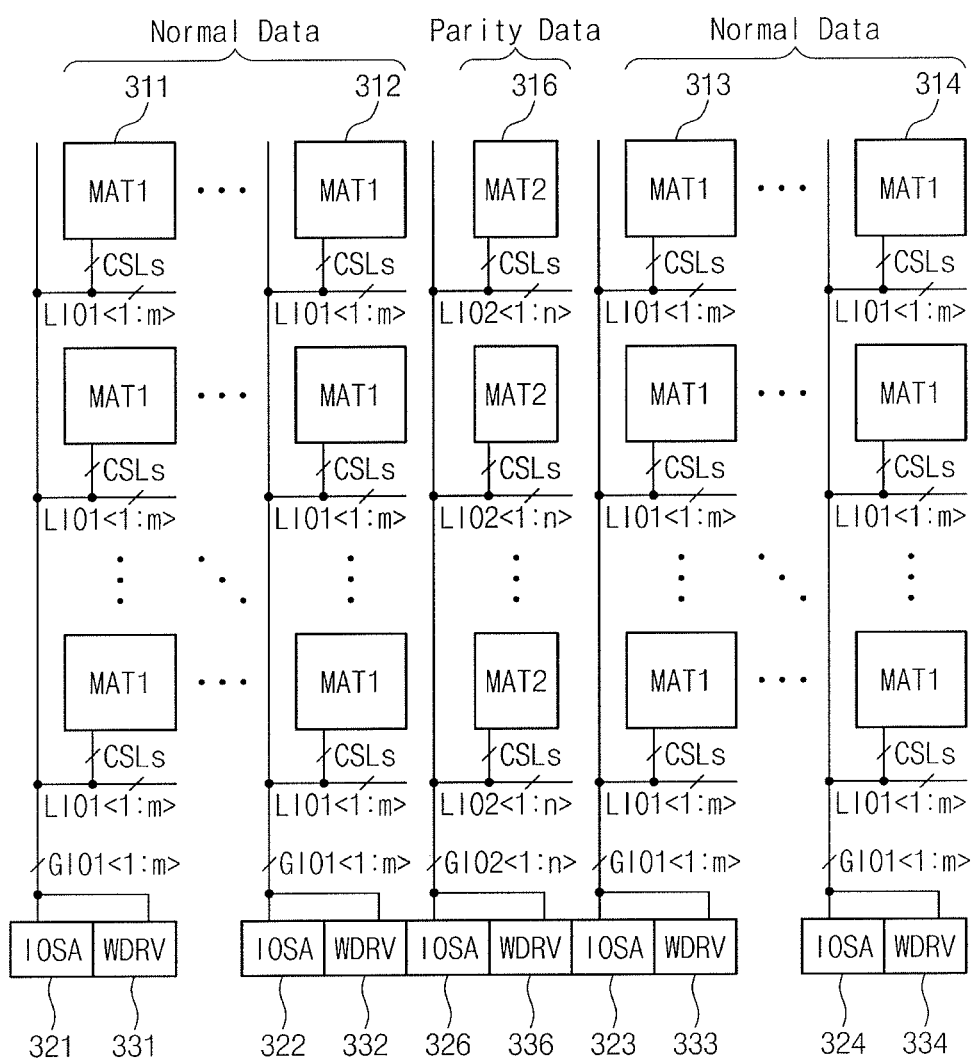
FIG. 7 illustrates another embodiment of a memory device.

FIG. 7 illustrates another embodiment of a memory device 300 which may include first mats 311 to 314, a second mat 316, first and second data output sense amplifiers (IOSA) 321 to 324 and 326, and first and second write drivers (WDRV) 331 to 334 and 336. Each of the first mats 311 to 314 may be implemented to be substantially the same as the first mat 110 of FIG. 1.

Data input/output for each of the first mats 311 to 314 may be performed through the first global lines GIO1<1:m> and the first local lines LIO1<1:m>. Depending on a read command or a write command, "m" bit lines of each of the first mats 311 to 314 disposed in a horizontal direction may be selected by a column select signal transmitted through one of column select lines CSLs. The number of the first mats 311 to 314 may be different in other embodiments and, for example, may be determined depending on the number of bits of data the memory device 300 is able to process. In an embodiment, sub word line drivers SWDs may be disposed between the first mats 311 to 314.

The second mat 316 may be, for example, substantially the same as the second mat 160 of FIG. 2. Data input/output for the second mat 316 may be performed through the second global lines G102<1:n> and the second local lines LIO2<1:n>. Depending on a read command or a write command, "n" bit lines of the second mats 316 may be selected by a column select signal that is transmitted through one of the column select lines CSLs. The number of the second mats 316 may be different in other embodiments. In an embodiment, sub word line drivers SWDs may be between the first mat 312 and the second mat 316 and between the first mat 313 and the second mat 316.

In an embodiment, the ratio of the number of the first global lines GIO1<1:m> to the number of the second global lines GIO1<1:n> may be the same as the ratio of the number of first memory cells of each of the first mats 311 to 314 to the number of second memory cells of the second mat 316.

In an embodiment, the memory device 300 may further include first and second mats disposed in a vertical direction.

Referring to the FIG. 7, the memory device 300 may further include first mats between the first mat 311 and the first write drivers 331. In a similar way, the memory device 300 may further include the first and second mats. The number of first and second mats of FIG. 7 may be determined according to a bank capacity, the number of banks, the whole memory capacity of the memory device 300, and/or other factors.

In an embodiment, the first mats 311 to 314 may store normal data and the second mats 316 may store parity data. The normal data may be, for example, data that the memory device 300 receives from an external device or data that the memory device 300 will provide to the external device. The parity data may be data for correcting an error that might occur in the normal data. The parity data may include parity bits corresponding to bits of the normal data. The parity data may be generated within the memory device 300 or may be provided from an external source.

The size of the parity data for error correction may vary, for example, with the kind of error correction code, the size of normal data, and/or the number of bits to be corrected. According to an embodiment, the memory device 300 may include the second mat 316 in which data input/output is performed through the second global lines GIO2<1:n> corresponding to various sizes of parity data. For example, the number of memory cells of the second mat 316, the number of the second local lines LIO2<1:n>, and the number of the second global lines GIO2<1:n> may be adjusted according to various sizes of the parity data. In an embodiment, "m" may be a value corresponding to a power of 2, "n" may be a value corresponding to a power of 2 or a multiple of 2, and "n" may be different from or less than "m".

The first data output sense amplifier 321 may sense and amplify voltages of the first global lines GIO1<1:m>, which are determined depending on bits output through the first global lines GIO1<1:m>. The first data output sense amplifier 321 may read bits output from the first mat 311 and mats between the first mat 311 and the first data output sense amplifier 321. For example, the first data output sense amplifier 321 may be adjacent to the first write driver 331. The remaining first data output sense amplifiers 322 to 324 may operate in a manner similar to the first data output sense amplifier 321.

The second data output sense amplifier 326 may operate in a manner similar to the first data output sense amplifier 321. In one embodiment, the first data output sense amplifier 321 may include "m" sub amplifiers respectively connected to the first global lines GIO1<1:m>, and the second data output sense amplifier 326 may include "n" sub amplifiers respectively connected to the second global lines GIO2<1:n>. As described above, "n" may be different from "m". For example, the size of the second data output sense amplifier 326 may be different from the size of the first data output sense amplifier 321, and may be determined, for example, depending on the horizontal length of the second mat 316.

The first write driver 331 may provide data to memory cells of the first mat 311 through the first global lines GIO1<1:m>, the first local lines LIO1<1:m>, and "m" bit lines selected by a column select signal transmitted through one of column select lines CSLs based on a write command. The data may include bits received through one data input/output pin DQ, or may include bits received through a plurality of data input/output pins (including the one data input/output pin) aligned at a rising edge or a falling edge of a data strobe signal. The remaining first write drivers 332 to 334 may operate in a manner substantially similar to the first write driver 331.

The second write driver 336 may operate in a manner substantially similar to the first write driver 331. The second write driver 336 may transmit parity data for normal data to memory cells of the second mat 316. In one embodiment, the first write driver 331 may include "m" sub drivers respectively connected to the first global lines GIO1<1:m>, and the second write driver 336 may include "n" sub drivers respectively connected to the second global lines GIO2<1:n>. As described above, "n" may be different from "m". For example, the size of the second write driver 336 may be different from the size of the first write driver 331, and may be determined, for example, depending on a horizontal length of the second mat 316.

Figure 8:
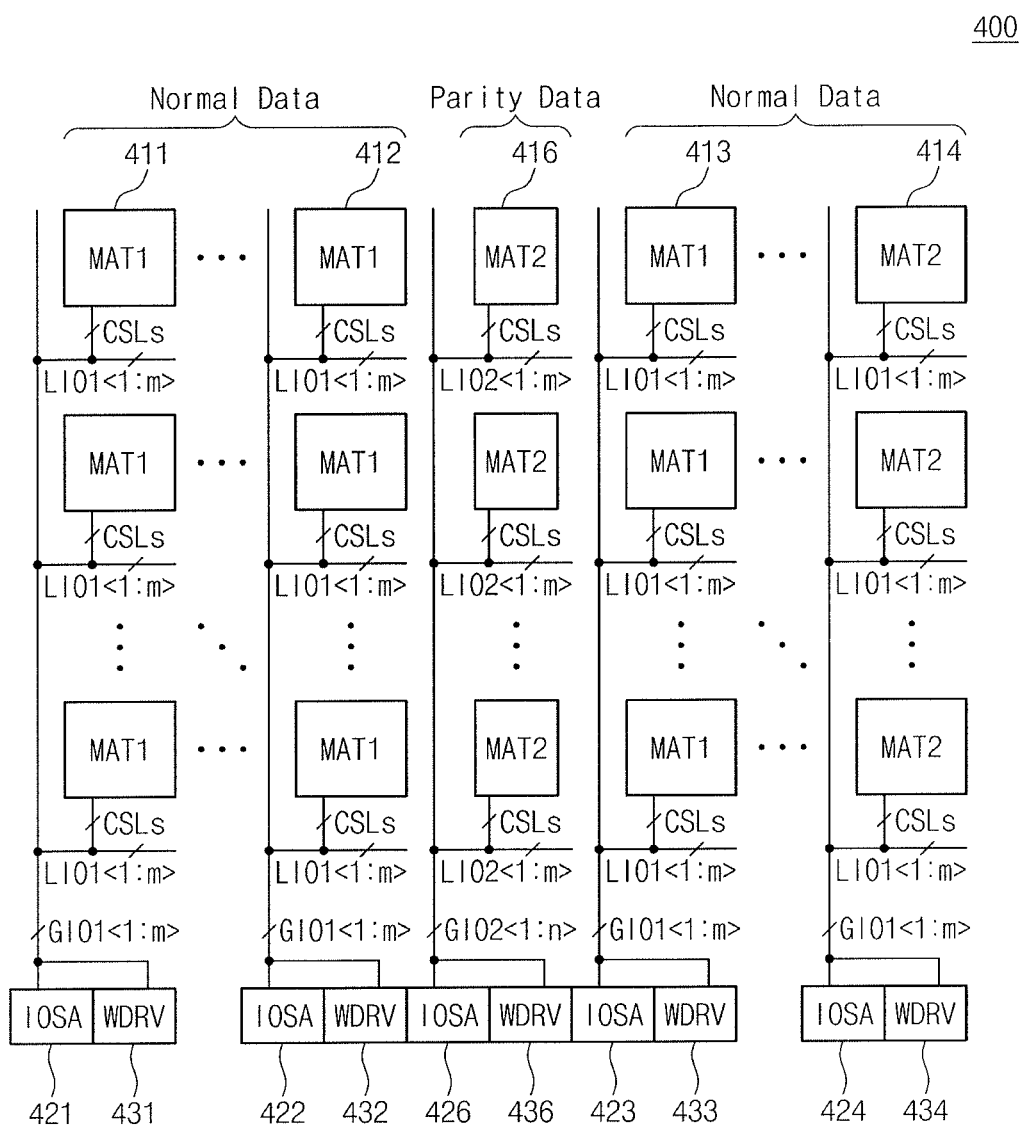
FIG. 8 illustrates another embodiment of a memory device.

FIG. 8 illustrates another embodiment of a memory device 400, which will be described with reference to FIGS. 4 and 7. Referring to FIG. 8, the memory device 400 may include first mats 411 to 414, a second mat 416, first and second data output sense amplifiers 421 to 424 and 426, and first and second write drivers 431 to 434 and 436.

The first mats 411 to 414, the first and second data output sense amplifiers 421 to 424 and 426, and the first and second write drivers 431 to 434 and 436 may be substantially the same as the first mats 311 to 314, the first and second data output sense amplifiers 321 to 324 and 326, and the first and second write drivers 331 to 334 and 336 of FIG. 7. Differences between the memory device 400 and the memory device 300 of FIG. 7 are described below.

The second mat 416 may be substantially the same as the second mat 260 of FIG. 4. Data input/output for the second mat 416 may be performed through the second global lines GIO2<1:n> and the second local lines LIO2<1:m>. Depending on a read command or a write command, "m" bit lines of the second mats 416 may be selected by a column select signal transmitted through one of the column select lines CSLs. The number of the second local lines LIO2<1:m> and the number of bit lines, which are selected by a column select signal transmitted through one of the column select lines CSLs, may be different from those of the second mat 316 of FIG. 7. Nevertheless, the second mat 416 may store parity data for normal data through an operation of the multiplexers of FIG. 6. For example, the second mat 416 may operate similar to the second mat 260 of FIG. 5.

Figure 9:
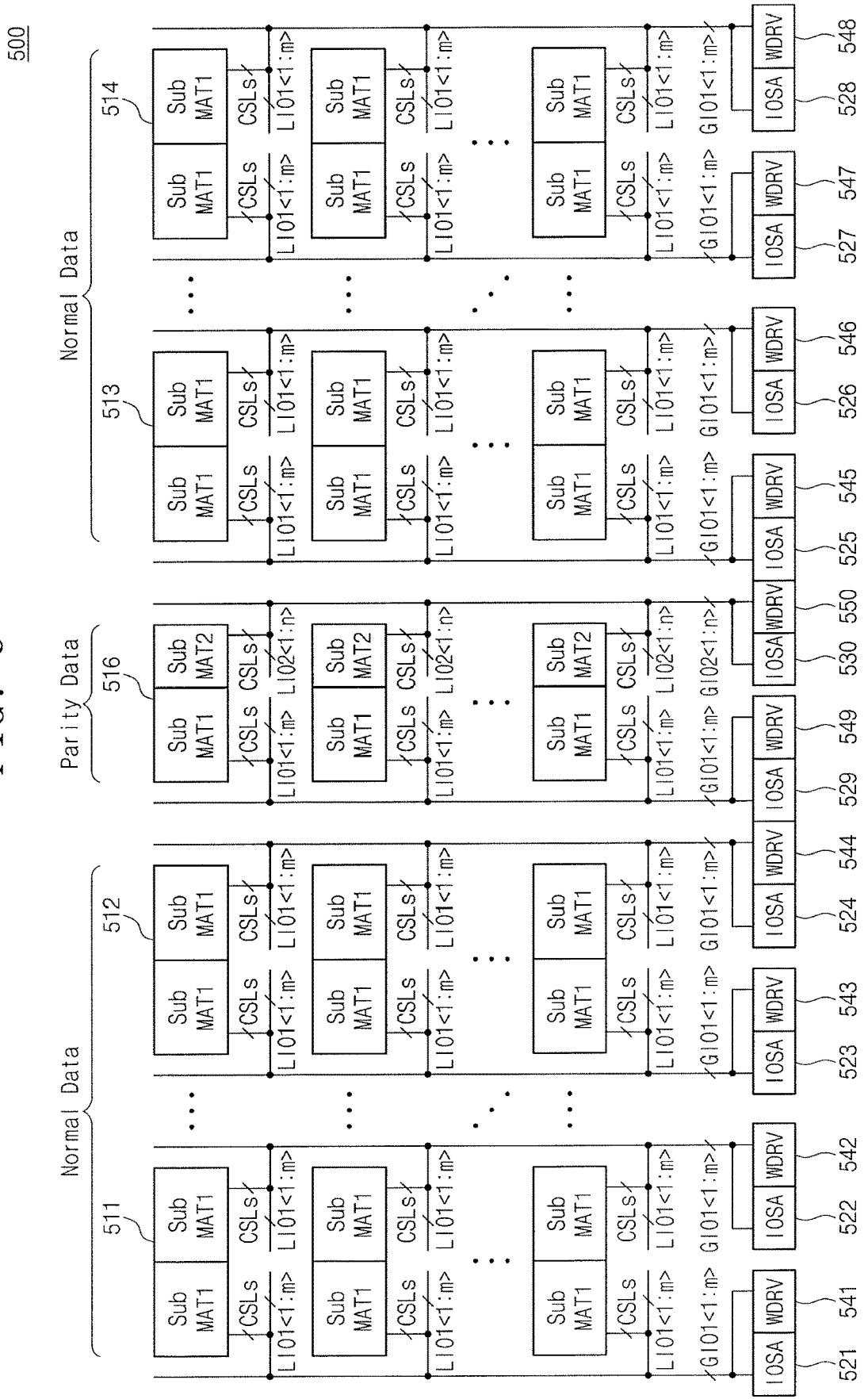
FIG. 9 illustrates another embodiment of a memory device.

FIG. 9 illustrates another embodiment of a memory device 500 which may include first mats 511 to 514, a second mat 516, first and second data output sense amplifiers 521 to 530, and first and second write drivers 541 to 550.

Each of the first mats 511 to 514 may include first sub mats. The first sub mat may be substantially the same as the first mat 110 of FIG. 1. Each of the first mats 511 to 514 may have a structure in which the first sub mats are contiguous. For example, the each of the first mats 511 to 514 may include at least two sub mats. In an embodiment, sub word line drivers SWDs may be between the first mats 511 to 514, and sub word line drivers SWDs may not be between the first sub mats of the first mat 511.

In each of the first sub mats, "m" bit lines may be selected by a column select signal, transmitted through one of the column select lines CSLs, depending on a read command or a write command. For example, in each of the first mats 511 to 514 of FIG. 9, two column select signals, for example, may be activated by the read command or the write command, and thus "2m" memory cells may be selected. As in the first mat 110 of FIG. 1, data input/output for the first sub mat may be performed through the first global lines GIO1<1:m>, the first local lines LIO1<1:m>, and "m" bit lines selected by a column select signal. Thus, compared with the first mat 110 of FIG. 1, more data bits (e.g., "2m" bits) may be output from each of the first mats 511 to 514 of FIG. 9 and more data bits (e.g., "2m" bits) may be stored in each of the first mats 511 to 514 of FIG. 9.

The second mat 516 may include a first sub mat and a second sub mat. The second mat 516 may include, for example, at least two sub mats. The first sub mat may be substantially the same as the first mat 110 of FIG. 1. The second sub mat may be substantially the same as the second mat 160 of FIG. 1. The second mat 516 may have a structure in which the first sub mat and the second sub mat are contiguous. In an embodiment, sub word line drivers SWDs may be between the first mat 512 and the second mat 516 and between the first mat 513 and the second mat 516, and sub word line drivers SWDs may not be between the first and second sub mats of the second mat 516.

In the second sub mat, "n" bit lines may be selected by a column select signal, transmitted through one of the column select lines CSLs, depending on a read command or a write command. In the second mat 516, two column select signals may be activated by the read command or the write command, and thus "m+n" memory cells may be selected. As in the second mat 160 of FIG. 1, data input/output for the second sub mat may be performed through the second global lines GIO2<1:n>, the second local lines LIO2<1:n>, and "n" bit lines selected by a column select signal. Thus, compared with the second mat 160 of FIG. 2, more data bits (e.g., "m+n" bits) may be output from the second mat 516 of FIG. 9 and more data bits (e.g., "m+n" bits) may be stored in the second mat 516.

In an embodiment, the ratio of two times the number (2m) of the first global lines GIO1<1:m> for each of the first mats 511 to 514 to a sum "m+n" of the number of the first global lines GIO1<1:m> and the number of the second global lines GIO<1:n> for the second mat 516 may be equal to the ratio of the number of first memory cells of each of the first mats 511 to 514 to the number of second memory cells of the second mat 516.

As in the memory device 300 of FIG. 7, the first mats 511 to 514 may store normal data and the second mat 516 may store parity data. The first data output sense amplifiers 521 to 529 and the first write drivers 541 to 549 may operate in a manner substantially the same as the first data output sense amplifiers 321 to 324 and the first write drivers 331 to 334 of FIG. 7, respectively. The second data output sense amplifier 530 and the second write driver 550 may operate in a manner substantially the same as the second data output sense amplifier 326 and the second write driver 336 of FIG. 7, respectively.

Figure 10:
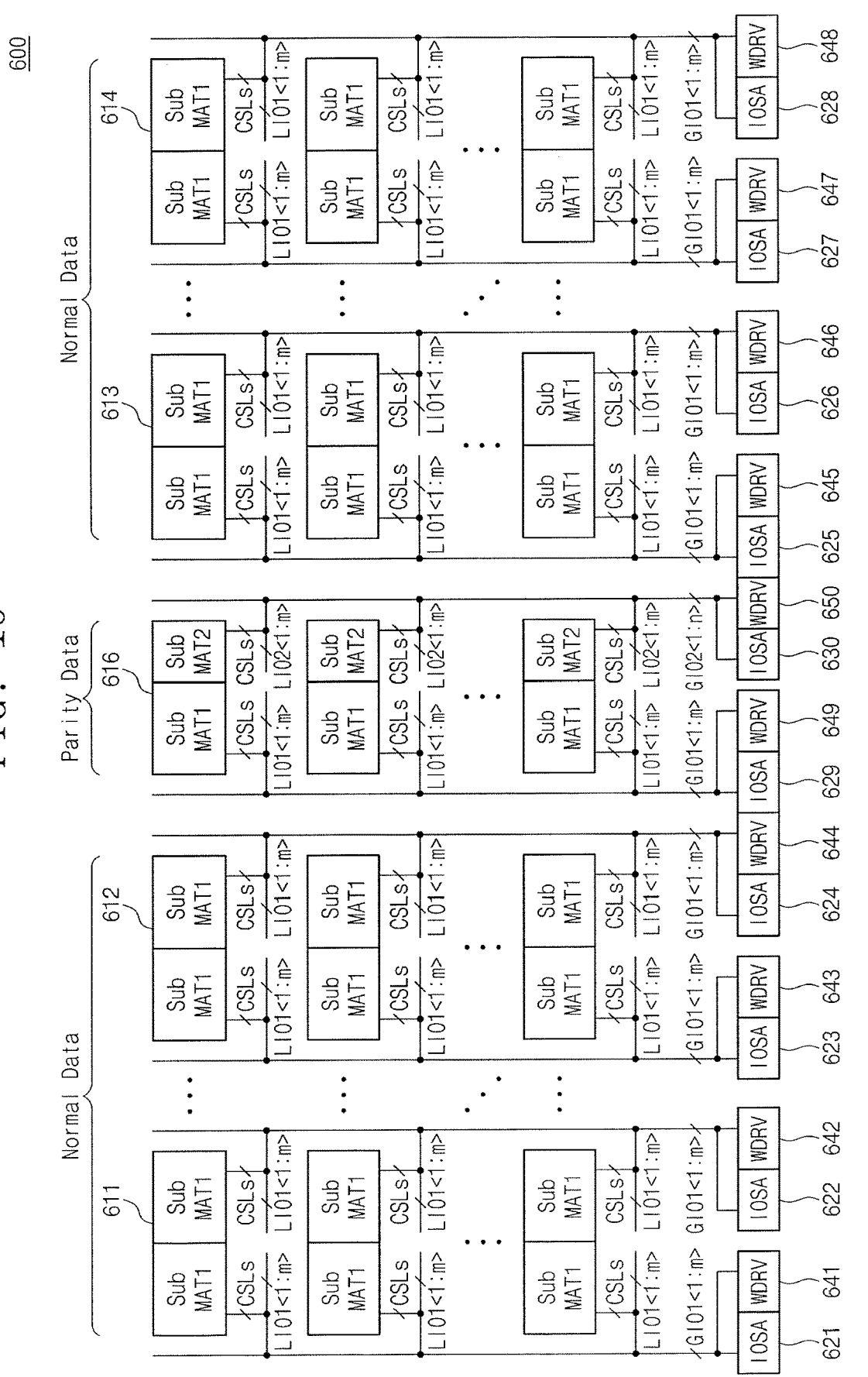
FIG. 10 illustrates another embodiment of a memory device.

FIG. 10 illustrates an embodiment of a memory device 600 that will be described with reference to FIGS. 4 and 9. Referring to FIG. 10, the memory device 600 may include first mats 611 to 614, a second mat 616, first and second data output sense amplifiers 621 to 630, and first and second write drivers 641 to 650.

The first mats 611 to 614, the first and second data output sense amplifiers 621 to 630, and the first and second write drivers 641 to 650 may be substantially the same as the first mats 511 to 514, the first and second data output sense amplifiers 521 to 530, and the first and second write drivers 541 to 550 of FIG. 9. Differences between the memory device 600 and the memory device 500 of FIG. 7 will be described below.

A second sub mat of the second mat 616 may be substantially the same as the second mat 260 of FIG. 4. Data input/output for the second sub mat may be performed through the second global lines GIO2<1:n> and the second local lines LIO2<1:m>. Depending on a read command or a write command, "m" bit lines of the second sub mat may be selected by a column select signal transmitted through one of the column select lines CSLs. Each of the number of the second local lines LIO2<1:m> and the number of bit lines are selected by a column select signal transmitted through one of the column select lines CSLs, and may be "m". The number "m" may be different from the number of the second sub mat of FIG. 9, namely "n". Nevertheless, the second mat 616 may store parity data for normal data through an operation of the multiplexers of FIG. 6.

Figure 11:
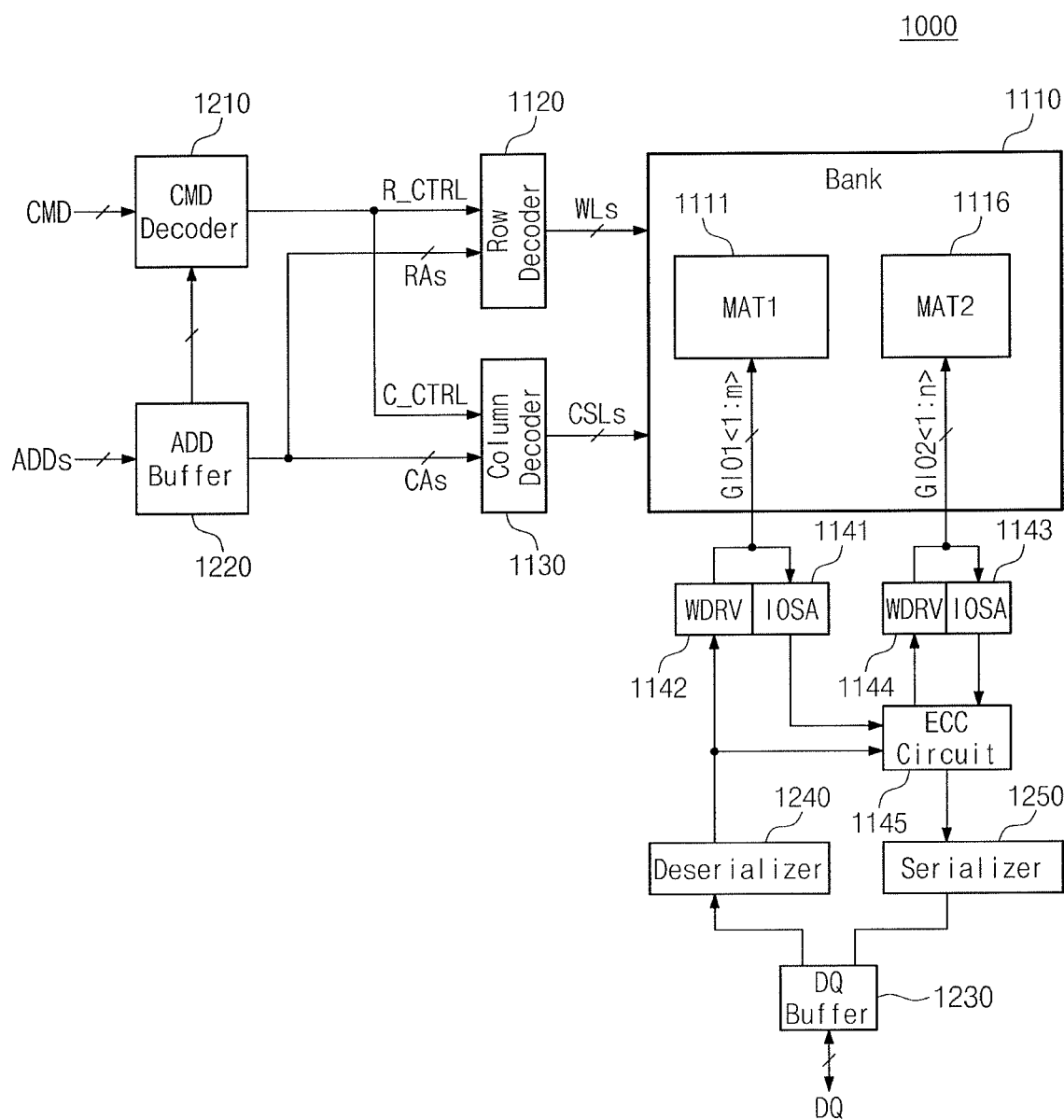
FIG. 11 illustrates another embodiment of a memory device.

FIG. 11 illustrates an embodiment of a memory device 1000 which may include a bank 1110, a row decoder 1120, a column decoder 1130, first and second data output sense amplifiers 1141 and 1143, first and second write drivers 1142 and 1144, an ECC circuit 1145, a command decoder 1210, an address buffer 1220, a DQ buffer 1230, a deserializer 1240, and a serializer 1250.

The bank 1110 may include memory cells at intersections of word lines WLs and bit lines. For example, the bank 1110 may correspond to one of the mat arrays pf FIGS. 7 to 10. One bank 1110 is illustrated in FIG. 11, but the number of banks may vary among different embodiments. The number and the capacity of banks may be determined, for example, according to the JEDEC standard.

The bank 1110 may include a first mat 1111 and a second mat 1116. One first mat 1111 and one second mat 1116 are illustrated in FIG. 11, but the numbers of first mats and second mats of the bank 1110 may be different in other embodiments. The first mat 1111 may operate substantially the same as the first mats 110 and 210 of FIGS. 1 and 4, and the second mat 1116 may operate substantially the same as the second mats 160 and 260 of FIGS. 1 and 4.

The row decoder 1120 may receive a row control signal R CTRL from the command decoder 1210 and row addresses RAs from the address buffer 1220 and may select one of the word lines WLs based on the row control signal R CTRL and the row addresses RAs. For example, when the memory device 1000 is a DRAM, the row decoder 1120 may select a word line corresponding to row addresses for an activation command.

The column decoder 1130 may receive a column control signal C_CTRL from the command decoder 1210 and column addresses CAs from the address buffer 1220, and may select column selection lines CSLs based on the column control signal C_CTRL and the column addresses CAs. When the column decoder 1130 selects the column select lines CSLs, bit lines connected to the column selection lines CSLs may also be selected.

The first data output sense amplifier 1141 may operate substantially the same as the first data output sense amplifiers 321 to 324, 421 to 424, 521 to 529, and 621 to 629 of FIGS. 7 to 10. The second data output sense amplifier 1143 may operate substantially the same as the second data output sense amplifiers 326, 426, 530, and 630 of FIGS. 7 to 10.

The first write driver 1142 may operate substantially the same as the first write drivers 331 to 334, 431 to 434, 541 to 549, and 641 to 649 of FIGS. 7 to 10. The second write driver 1144 may operate substantially the same as the second write drivers 336, 436, 550, and 650 of FIGS. 7 to 10.

The ECC circuit 1145 may generate an error correction code (ECC) for correcting an error of data. The ECC circuit 1145 may receive write data from the deserializer 1240 and perform error correction encoding on the write data to generate a parity bit. The ECC circuit 1145 may transmit parity bits to the second write driver 1144.

The ECC circuit 1145 may perform error correction decoding on read data output form the bank 1110 and sensed by the first and second data output sense amplifiers 1141 and 1143. The ECC circuit 1145 may correct an error based on parity bits output from the second data output sense amplifier 1143. The ECC circuit 1145 performs various error correction schemes, including but not limited to reed-solomon (RS) coding, hamming coding, Bose-Chaudhuri-Hocquenghem (BCH) coding, and low density parity check (LDPC) coding.

In an embodiment, the memory device 1000 may not include the ECC circuit 1145. In this case, the memory device 1000 may receive write data and parity data for correcting an error of the write data from an external source and may output read data and parity data for correcting an error of the read data to the or another external source.

The command decoder 1210 may receive and decode a command from the outside (e.g., a host or a memory controller) of the memory device 1000. For example, the command decoder 1210 may decode an activation command, a write command, a read command, a precharge command, and/or another command. Also, the command decoder 1210 may further receive address information from the address buffer 1220. For example, the memory device 1000 may include input pins to receive both a command and an address for reducing the number of input pins. Accordingly, the command decoder 1210 may decode a command using a signal received from the address buffer 1220.

The command decoder 1210 may control the row decoder 1120 depending on the activation command, the precharge command, or a refresh command. The command decoder 1210 may control the column decoder 1130 depending on a write command or a read command. The command decoder 1210 may provide the row control signal R_CTRL to the row decoder 1120 and may provide the column control signal C_CTRL to the column decoder 1130. The command decoder 1210 may also control other components of the memory device 1000.

The address buffer 1220 may receive and store addresses ADDs from a device external to the memory device 1000. For example, the address buffer 1220 may receive and store bank addresses BAs and row addresses RAs for the activation command, column addresses CAs for the write command or the read command, bank addresses for the precharge command, and an operation code (OP code) for setting mode registers.

The address buffer 1220 may provide the row addresses RAs for the activation command to the row decoder 1120 and the column addresses CAs for the write command or the read command to the column decoder 1130. The address buffer 1220 may provide address information input as a command to the command decoder 1210.

The DQ buffer 1230 may receive write data from the outside of the memory device 1000 and may output read data output from the bank 1110. The DQ buffer 1230 may drive a data input/output pin. The deserializer 1240 may deserialize write data received through the DQ buffer 1230 and may provide the deserialized write data to the first and second write drivers 1142 and 1144 and the ECC circuit 1145. The serializer 1250 may serialize read data from the ECC circuit 1145 and may provide the serialized read data to the DQ buffer 1230. When the memory device 1000 does not include the ECC circuit 1145, the serializer 1250 may serialize read data from the first and second data output sense amplifiers 1141 and 1143 and may provide the serialized read data to the DQ buffer 1230.

In accordance with one or more embodiments, the number of global lines may be determined according to data of various sizes. A memory device may include a mat in which data input/output is performed through such global lines. Accordingly, the area and layout of the memory device may be improved.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device, comprising:
a first memory cell group and a second memory cell group each having first memory cells connected to first bit lines, the first memory cell group and the second memory cell group sharing first local lines that are connected to the first bit lines by first column select switches;
a third memory cell group and a fourth memory cell group each having second memory cells connected to second bit lines, the third memory cell group and the fourth memory cell group sharing second local lines that are connected to the second bit lines by second column select switches;
a first transmitter connected to the first local lines to transmit first data to first global lines based on a read command, the first data being output from one of the first memory cell group and the second memory cell group on the first local lines; and
a second transmitter connected to the second local lines to transmit second data to second global lines based on the read command, the second data being output from one of the third memory cell group and the fourth memory cell group on the second local lines, wherein:
the first memory cell group includes a first number of the first memory cells, and the third memory cell group includes a second number of the second memory cells,
the memory device includes a third number of the first global lines and a fourth number of the second global lines,
the third number of the first global lines is different from the fourth number of the second global lines, and
a ratio of the third number of the first global lines to the fourth number of the second global lines is equal to a ratio of the first number of the first memory cells to the second number of the second memory cells.

2. The memory device as claimed in claim 1, wherein:
the memory device includes an equal number of the first global lines and the first local lines, and
the memory device includes an equal number of the second global lines and the second local lines.

3. The memory device as claimed in claim 1, wherein the memory device includes an equal number of the first global lines, the first local lines, and the second local lines.

4. The memory device as claimed in claim 3, wherein:
the number of the second local lines is greater than the number of the second global lines,
the memory device includes multiplexers to connect part of the second local lines to the second transmitter depending on row addresses or column addresses corresponding to the one of the third memory cell group and the fourth memory cell group, and
the second transmitter to transmit part of the second data to the second global lines.

5. The memory device as claimed in claim 1, wherein:
the second data are to correct an error of the first data, and
the fourth number of the second global lines is less than the third number of the first global lines.

6. The memory device as claimed in claim 1, wherein:
the first transmitter includes first local switches to connect the first local lines and the first global lines based on the read command, and
the second transmitter includes second local switches to connect the second local lines and the second global lines based on the read command.

7. The memory device as claimed in claim 1, wherein:
the first transmitter includes first local sense amplifiers to drive the first global lines depending on the first data, and
the second transmitter includes second local sense amplifiers to drive the second global lines depending on the second data.

8. A memory device, comprising:
first memory cells corresponding to column addresses, the first memory cells being connected to first global lines to receive first data via the first global lines;
second memory cells corresponding to the column addresses, the second memory cells being connected to second global lines to receive second data via the second global lines;
a first write driver connected to the first global lines to transmit the first data to a part of the first memory cells through the first global lines based on a write command; and
a second write driver connected to the second global lines to transmit second data to a part of the second memory cells through the second global lines based on the write command, wherein:
the memory device includes a first number of the first memory cells and a second number of the second memory cells,
the memory device includes a third number of the first global lines and a fourth number of the second global lines,
the third number of the first global lines is different from the fourth number of the second global lines, and
a ratio of the third number of the first global lines to the fourth number of the second global lines is equal to a ratio of the first number of the first memory cells to the second number of the second memory cells.

9. The memory device as claimed in claim 8, further comprising:
first line select switches to connect the first global lines and first local lines based on the write command; and
second line select switches to connect the second global lines and second local lines based on the write command.

10. The memory device as claimed in claim 9, further comprising:
first column select switches to connect first bit lines connected to the part of the first memory cells and the first local lines based on the write command; and
second column select switches to connect second bit lines connected to the part of the second memory cells and the second local lines based on the write command.

11. The memory device as claimed in claim 10, wherein:
the memory device includes an equal number of the first global lines, the first local lines, and the first bit lines, and
the memory device includes an equal number of the second global lines, of the second local lines, and the second bit lines.

12. The memory device as claimed in claim 10, wherein the memory device includes an equal number of the first global lines, the first local lines, the first bit lines, the second local lines, and the second bit lines.

13. The memory device as claimed in claim 12, wherein:
the number of the second local lines is greater than the number of the second global lines, and
the memory device includes multiplexers to connect a part of the second local lines to the second line select switches depending on row addresses or column addresses corresponding to the part of the second memory cells.

14. The memory device as claimed in claim 8, wherein:
the second data is to correct an error of the first data, and
the fourth number of the second global lines is less than the third number of the first global lines.

15. A memory device, comprising:
first memory cells connected to first bit lines and selected depending on a first column select signal transmitted through a first column select line;
second memory cells connected to second bit lines and selected depending on a second column select signal transmitted through a second column select line;
first column select switches to connect the first bit lines connected to the first memory cells and first local lines depending on the first column select signal;
second column select switches to connect the second bit lines connected to the second memory cells and second local lines depending on the second column select signal;
a first transmitter connected to the first local lines to transmit first data to first global lines based on a read command, the first data output from the first memory cells to the first local lines through the first bit lines; and
a second transmitter connected to the second local lines to transmit second data to second global lines in response to the read command, the second data output from the second memory cells to the second local lines through the second bit lines, wherein:
a number of the first global lines is different from a number of the second global lines, and
the memory device includes an equal number of the first global lines, the first local lines, the first column select switches, the first bit lines, and the first memory cells, and
the memory device includes an equal number of the second global lines, the second local lines, the second column select switches, the second bit lines, and the second memory cells.

16. The memory device as claimed in claim 15, wherein the number of the first global lines, the number of the first local lines, the number of the first column select switches, the number of the first bit lines, the number of the first memory cells, the number of the second local lines, the number of the second column select switches, the number of the second bit lines, and the number of the second memory cells are equal.

17. The memory device as claimed in claim 16, wherein:
the number of the second local lines is greater than the number of the second global lines,
the memory device includes multiplexers to connect a part of the second local lines to the second transmitter depending on row addresses or column addresses corresponding to the second memory cells, and
the second transmitter is to transmit a part of the second data to the second global lines.

18. The memory device as claimed in claim 15, further comprising:
a first data output sense amplifier to sense the first data output to the first global lines; and
a second data output sense amplifier to sense the second data output to the second global lines.

* * * * *